(12) United States Patent
Tanaka

(10) Patent No.: US 9,153,525 B2
(45) Date of Patent: Oct. 6, 2015

(54) SEMICONDUCTOR DEVICE

(71) Applicant: Toru Tanaka, Nagoya (JP)

(72) Inventor: Toru Tanaka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/073,059

(22) Filed: Nov. 6, 2013

(65) Prior Publication Data

US 2014/0145341 A1    May 29, 2014

(30) Foreign Application Priority Data

Nov. 29, 2012 (JP) ................................ 2012-261126

(51) Int. Cl.
*H01L 23/48* (2006.01)
*H01L 23/495* (2006.01)
*H01L 23/00* (2006.01)

(52) U.S. Cl.
CPC .... *H01L 23/49513* (2013.01); *H01L 23/49562* (2013.01); *H01L 24/32* (2013.01); *H01L 24/05* (2013.01); *H01L 24/06* (2013.01); *H01L 24/29* (2013.01); *H01L 24/33* (2013.01); *H01L 2224/04026* (2013.01); *H01L 2224/05624* (2013.01); *H01L 2224/06181* (2013.01); *H01L 2224/2908* (2013.01); *H01L 2224/29111* (2013.01); *H01L 2224/29118* (2013.01); *H01L 2224/29339* (2013.01); *H01L 2224/29355* (2013.01); *H01L 2224/32245* (2013.01); *H01L 2224/33181* (2013.01); *H01L 2224/8384* (2013.01); *H01L 2224/83825* (2013.01); *H01L 2924/0002* (2013.01); *H01L 2924/0132* (2013.01); *H01L 2924/10253* (2013.01); *H01L 2924/1305* (2013.01); *H01L 2924/13055* (2013.01); *H01L 2924/13091* (2013.01); *H01L 2924/15747* (2013.01)

(58) Field of Classification Search
CPC ............ H01L 23/492; H01L 23/49513; H01L 24/05624; H01L 24/29124; H01L 24/06; H01L 24/32; H01L 24/33
See application file for complete search history.

(56) References Cited

U.S. PATENT DOCUMENTS

| | | | |
|---|---|---|---|
| 4,077,045 A * | 2/1978 | Greeson et al. | 257/765 |
| 2002/0191378 A1* | 12/2002 | Suzuki et al. | 361/704 |
| 2012/0098127 A1* | 4/2012 | Sutardja et al. | 257/737 |
| 2013/0032845 A1* | 2/2013 | Chuang et al. | 257/99 |
| 2014/0111956 A1* | 4/2014 | Taniguchi | 361/771 |

FOREIGN PATENT DOCUMENTS

| | | |
|---|---|---|
| JP | A-2006-179655 | 7/2006 |
| JP | A-2011-129619 | 6/2011 |
| JP | A-2011-181840 | 9/2011 |

* cited by examiner

*Primary Examiner* — A. Sefer
(74) *Attorney, Agent, or Firm* — Oliff PLC

(57) ABSTRACT

A semiconductor device includes: a semiconductor element that includes an electrode layer on a surface of the semiconductor element; a low-strength layer that is provided on a surface of the electrode layer; a bonding layer that is provided on a surface of the low-strength layer; and a conductive plate that is provided on a surface of the bonding layer. Strength of the bonding layer is higher than strength of the electrode layer, and strength of the low-strength layer is lower than the strength of the electrode layer.

2 Claims, 1 Drawing Sheet

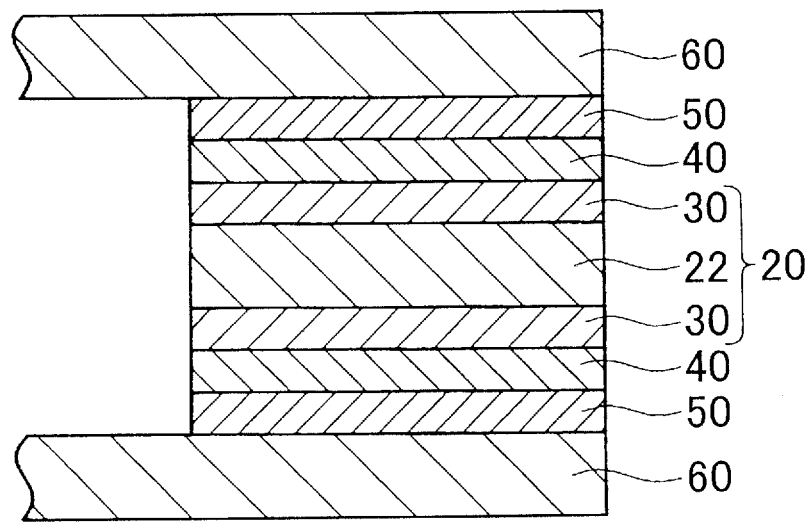

SEMICONDUCTOR DEVICE

INCORPORATION BY REFERENCE

The disclosure of Japanese Patent Application No. 2012-261126 filed on Nov. 29, 2012 including the specification, drawings and abstract is incorporated herein by reference in its entirety.

BACKGROUND OF THE INVENTION

1. Field of the Invention

The present invention relates to a semiconductor device.

2. Description of Related Art

For example, Japanese Patent Application Publication No. 2011-129619 (JP 2011-129619 A) discloses a semiconductor device in which a conductive plate is fixed on an electrode layer provided on a surface of a semiconductor element with a solder layer therebetween.

When the conductive plate is fixed on a semiconductor element driven at high temperatures with the solder layer therebetween, the solder layer can be a high-melting point solder material. However, the high-melting point solder material has higher strength than the electrode layer in general. Therefore, when thermal stress is repeatedly exerted on the electrode layer and the solder layer due to heat generation and heat dissipation of the semiconductor element, the electrode layer can be damaged prior to the solder layer.

SUMMARY OF THE INVENTION

The present invention provides a semiconductor device that can inhibit the electrode layer from being damaged.

A first aspect of the present invention relates to the semiconductor device. The semiconductor device includes: a semiconductor element that includes an electrode layer on a surface of the semiconductor element; a low-strength layer that is provided on a surface of the electrode layer; a bonding layer that is provided on a surface of the low-strength layer; and a conductive plate that is provided on a surface of the bonding layer. Strength of the bonding layer is higher than strength of the electrode layer, and strength of the low-strength layer is lower than the strength of the electrode layer.

In the aforementioned aspect, the strength of the bonding layer is higher than that of the electrode layer, and the strength of the low-strength layer is lower than that of the electrode layer. Therefore, when the thermal stress is repeatedly exerted on the electrode layer and the bonding layer due to the heat generation and the heat dissipation of the semiconductor element, the low-strength layer is easily damaged prior to the electrode layer. Thus, the damage of the electrode layer can be inhibited.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 1 is a cross-sectional view that shows a principal part of a semiconductor device according to an example of the present invention.

DETAILED DESCRIPTION OF EMBODIMENTS

Major technical elements of examples according to the present invention will be described below. It should be noted that the technical elements described below are independent of one another and exert technical usefulness independently or in combination with various elements. Therefore, the present invention is not limited to the combination that is described in the claims of the application as originally filed.

(Technical Element)

The electrode layer may be made of AlSi, and the low-strength layer may be made of Al.

Incidentally, the ten "strength" herein means the strength against the stress acting upon each layer. For example, the strength may be defined by the magnitude of yield strength (yield stress). It can be said that the strength is higher as the yield strength is higher. In addition, when a material in which the yield strength is not easily defined (a material in which a yield point is not clearly defined) is used, it is known that 0.2% proof stress may be used as a substitute for the yield strength. In this specification, the 0.2% proof stress may be described as an example of the "strength." The magnitude of the 0.2% proof stress can be measured through a testing method (tensile test) designated by Japanese Industrial Standards (JIS), for example.

Furthermore, the "strength" can be defined by the magnitude of fatigue strength, for example. It can be said that the strength is higher as the fatigue strength is higher. In this specification, the fatigue strength may be described as an example of the "strength." The magnitude of the fatigue strength can be measured through a testing method (fatigue test) designated by JIS, for example.

A semiconductor device 10 shown in FIG. 1 includes a semiconductor element 20, a low-strength layer 40, a bonding layer 50, and a conductive plate 60. In the semiconductor device 10 of examples in the present invention, conductive plates 60 are fixed on the front and the back sides of the semiconductor element 20 with the low-strength layers 40 and bonding layers 50 therebetween. In the following examples, an upper surface and a lower surface in the drawing may respectively be referred to as a "front side" and a "back side" with respect to the semiconductor element 20, the low-strength layers 40, the bonding layers 50, and the conductive plates 60.

The semiconductor element 20 includes a semiconductor substrate 22 and electrode layers 30 that are provided on the front and the back sides of the semiconductor substrate 22. The semiconductor substrate 22 is made of silicon (Si), for example. The electrode layer 30 may be made of AlSi. In the examples of the present invention, the semiconductor element 20 is a vertical insulated-gate bipolar transistor (IGBT). In other examples, the semiconductor element 20 may be other power semiconductor elements (such as a rectifier diode and a MOSFET). In the examples of the present invention, the semiconductor element 20 is driven at high temperatures.

The low-strength layers 40 are provided on the front and the back sides of the semiconductor element 20. In other words, the low-strength layers 40 are provided on the front side of the electrode layer 30 that is positioned on the upper side in the drawing and the back side of the electrode layer 30 that is positioned on the lower side in the drawing. In the examples of the present invention, the low-strength layer 40 is made of Al. The low-strength layers 40 are formed by sputtering Al onto the front and the back sides of the semiconductor element 20. The strength of the low-strength layer 40 made of Al is lower than that of the electrode layer 30 made of AlSi. Hereinafter, the examples of the present invention are exemplified with a case where the 0.2% proof stress is used as a criterion of the "strength". That is, in the examples of the present invention, the 0.2% proof stress of the low-strength layer 40 is lower than that of the electrode layer 30.

The bonding layers 50 are provided on the front side of the low-strength layer 40 that is positioned on the upper side in the drawing and the back side of the low-strength layer 40 that is positioned on the lower side in the drawing. The bonding layer 50 is made of Sn—Sb based solder. Therefore, the 0.2% proof stress of the bonding layer 50 is higher than that of the electrode layer 30 made of AlSi. In other examples, the bonding layer 50 can be any layers as long as the layer has higher 0.2% proof stress than the electrode layer 30 and a relatively high melting point, including a Zn—Al based solder layer, an Ni nanoparticle sintered compact layer, an Ag nanoparticle sintered compact layer, and a TLP bonding (liquid phase diffusion bonding) layer in which SnCu or SuNi is used as an insert material. In the examples of the present invention, the melting point of the bonding layer 50 is higher than the temperature during the driving of the semiconductor element 20.

The conductive plates 60 are provided on the front side of the bonding layer 50 that is positioned on the upper side in the drawing and the back side of the bonding layer 50 that is positioned on the lower side in the drawing. The conductive plate 60 is a lead frame that is made of Cu. The conductive plate 60 functions as a heat sink that dissipates heat generated by the semiconductor element 20. The conductive plate 60 is fixed on the low-strength layer 40 with the bonding layer 50 therebetween.

As described above, in the examples of the present invention, the 0.2% proof stress of the bonding layer 50 is higher than that of the electrode layer 30, and the 0.2% proof stress of the low-strength layer 40 is lower than that of the electrode layer 30. Therefore, when the thermal stress is repeatedly exerted on the electrode layer 30 and the bonding layer 50 due to the heat generation and the heat dissipation of the semiconductor element 20, the low-strength layer 40 is damaged prior to the electrode layer 30. Thus, the damage of the electrode layer 30 can be inhibited.

EXPERIMENTAL EXAMPLE

Hereinafter, experiments in which the present inventor has performed in order to verify the effects of the semiconductor device 10 of the examples are described. In these examples, as shown in the following Examples 1 through 6, semiconductor devices 10 that included various bonding layers 50 were prepared. On each semiconductor device 10, temperature cycling from 200° C. to –40° C. was repeated for 3,000 cycles, and damaged portions were verified. For comparison, as shown in the following Comparative Examples 1 through 6, semiconductor devices that included various bonding layers 50 but excluded the low-strength layers 40 were prepared. The same experiments were performed to the respective semiconductor devices.

Examples 1 through 6 are the semiconductor device 10 shown in FIG. 1. The bonding layers 50 of the Examples 1 through 6 were prepared as follows. In addition, the electrode layer 30 was made of AlSi, and the low-strength layer 40 was made of Al. Thus, all the 0.2% proof stresses of the bonding layers 50 of the Examples 1 through 6 were higher than those of the electrode layers 30 and lower than those of the low-strength layers 40.

(Example 1) Layer of Sn 13-6 SbCu (Sn—Sb based solder)
(Example 2) Layer of Zn 6-4 Al (Zn—Al based solder)
(Example 3) Layer of Ni nanoparticle sintered compact
(Example 4) Layer of Ag nanoparticle sintered compact
(Example 5) TLP bonding layer (SnCu is used as the insert material.)
(Example 6) TLP bonding layer (SuNi is used as the insert material.)

Comparative Examples 1 through 6 are semiconductor devices in which the low-strength layers 40 have been excluded from the semiconductor device 10 shown in FIG. 1. That is, in the Comparative Examples 1 through 6, the conductive plate 60 was directly fixed on the electrode layer 30 made of AlSi with the bonding layer 50 therebetween. The bonding layers 50 of the Comparative Examples 1 through 6 were prepared in the same manners as the bonding layers 50 of the Examples 1 through 6.

(Comparative Example 1) Layer of Sn 13-6 SbCu (Sn—Sb based solder)
(Comparative Example 2) Layer of Zn 6-4 Al (Zn—Al based solder)
(Comparative Example 3) Layer of Ni nanoparticle sintered compact
(Comparative Example 4) Layer of Ag nanoparticle sintered compact
(Comparative Example 5) TLP bonding layer (SnCu is used as the insert material.)
(Comparative Example 6) TLP bonding layer (SuNi is used as the insert material.)

On each of the Examples 1 through 6 and the Comparative Examples 1 through 6, temperature cycling from 200° C. to –40° C. was repeated for 3,000 cycles. As a result, the low-strength layers 40 made of Al were damaged in the Examples 1 through 6, and the electrode layers 30 made of AlSi were damaged in the Comparative Examples 1 through 6.

The experimental results described above reveal the following facts. In the semiconductor device 10 of the examples of the present invention, the low-strength layer 40 is provided between the electrode layer 30 and the bonding layer 50, and the 0.2% proof stress of the low-strength layer 40 is lower than that of the electrode layer 30. Therefore, even when the thermal stress is repeatedly exerted on the electrode layer 30 and the bonding layer 50, the low-strength layer 40 is damaged prior to the electrode layer 30. Thus, the damage of the electrode layer 30 can be inhibited.

The semiconductor device 10 of the examples in the present invention has been described so far. Now, a correspondence relationship between the examples and claims will be described. Both of the front and the back sides of the semiconductor element 20 in the examples are examples of the "surfaces (of the semiconductor element)". Both of the front side of the electrode layer 30 that is positioned on the upper side in the drawing and the back side of the electrode layer 30 that is positioned on the lower side in the drawing are examples of the "surfaces of the electrode layer". Both of the front side of the low-strength layer 40 that is positioned on the upper side in the drawing and the back side of the low-strength layer 40 that is positioned on the lower side in the drawing are examples of the "surfaces of the low-strength layer". Both of the front side of the bonding layer 50 that is positioned on the upper side in the drawing and the back side of the bonding layer 50 that is positioned on the lower side in the drawing are examples of the "surfaces of the bonding layer".

The technique of the present invention has been disclosed and described in detail in this specification with reference to examples thereof. However, it is to be understood that those examples are merely illustrative and claims of the present invention are not limited to those examples. Techniques that are disclosed in the claims of the present invention are intended to cover various modifications and changes of the example embodiments that are described above. For example, the following modifications may be used.

Modification 1

In the examples described above, the 0.2% proof stress is used as the criterion that represents the strength of the electrode layer 30, the low-strength layer 40, and the bonding layer 50. However, the present invention is not limited to this, and any other criteria that represent the strength of the electrode layer 30, the low-strength layer 40, and the bonding layer 50 can be used as long as the criteria represent the strength against the stress acting upon each layer (breaking strength). For example, the fatigue strength can be used as the criterion of strength. In such a case, the fatigue strength of the bonding layer 50 may be higher than that of the electrode layer 30, and the fatigue strength of the low-strength layer 40 may be lower than that of the electrode layer 30.

Modification 2

The circumference of the semiconductor device 10 may be sealed with resins. As sealing resin materials in this case, resins such as epoxy resins, polyimide resins, and polyamide resins can be used.

Modification 3

In the examples described above, the low-strength layers 40, the bonding layers 50, and the conductive plates 60 are provided on both of the front and the back sides of the semiconductor element 20. However, the present invention is not limited to this, and the low-strength layer 40, the bonding layer 50, and the conductive plate 60 may be provided on only one side of the semiconductor element 20.

In addition, the technical elements that are disclosed in the specification and the drawings exhibit technical usefulness alone or in various combinations and configurations. The techniques that are illustrated in this specification and the drawings achieve a plurality of objects simultaneously, and the achievement of one object thereof itself has technical usefulness.

What is claimed is:

1. A semiconductor device comprising:
    a semiconductor element that includes an electrode layer on a surface of the semiconductor element;
    a first low-strength layer that is directly provided on a surface of the electrode layer;
    a first bonding layer that is provided on a surface of the first low-strength layer; and
    a conductive plate that is provided on a surface of the first bonding layer,
    a second low-strength that is on bottom side of the semiconductor element; and
    a second bonding layer that is on the bottom side of the semiconductor element,
    wherein strength against stress acting upon the first bonding layer is higher than strength against stress acting upon the electrode layer, and strength against stress acting upon the first low-strength layer is lower than the strength against stress acting upon the electrode layer.

2. The semiconductor device according to claim 1,
    wherein the electrode layer is made of AlSi, and the first low-strength layer is made of Al.

* * * * *